United States Patent
Oohashi et al.

[11] Patent Number: 6,078,393
[45] Date of Patent: *Jun. 20, 2000

[54] PHASE SHIFT MASK INSPECTION APPARATUS

[75] Inventors: Katsuki Oohashi; Takeshi Fujiwara, both of Yokohama; Akira Ono, Tokyo, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/923,088

[22] Filed: Sep. 4, 1997

[30] Foreign Application Priority Data

Sep. 4, 1996 [JP] Japan .................................. 8-234270

[51] Int. Cl.[7] .................................................. G01B 9/02
[52] U.S. Cl. ........................................... 356/351; 356/345
[58] Field of Search ...................... 356/345, 351

[56] References Cited

U.S. PATENT DOCUMENTS 4,869,593  9/1989  Biegen ..................................... 356/351

FOREIGN PATENT DOCUMENTS 62-289704  12/1987  Japan .
4-151662   5/1992   Japan .

OTHER PUBLICATIONS

A.P. Ghosh, et al., "Direct Phase Measurements In Phase Shift Masks", Integrated Circuit Metrology, Inspection, and Process Control VI, SPIE vol. 1673, (1992), pp. 242–254.

*Primary Examiner*—Robert H. Kim
*Assistant Examiner*—Andrew H. Lee
*Attorney, Agent, or Firm*—Oblon, Spivak, McClelland, Maier & Neustadt, P.C.

[57] ABSTRACT

A phase shift mask inspection apparatus according to the present invention comprises a laser light source for outputting laser light in a deep ultraviolet region, optical conversion means for converting the laser light outputted from the laser light source into light of a point source group consisting of a plurality of point sources, an illumination optical system for separating the light of the point source group converted by the optical conversion means into two polarized light beams shifted sideways and illuminating these polarized light beams onto a phase shift mask in which a phase shifter is formed, a sensing optical system for superimposing the two polarized light beams passed through the phase shift mask on one another to produce interference light, and phase value computing means for calculating the phase value at the phase shifter in the phase shift mask on the basis of the intensify of the interference light produced by the sensing optical system.

15 Claims, 5 Drawing Sheets

PHASE SHIFT MASK INSPECTION APPARATUS

BACKGROUND OF THE INVENTION

This invention relates to an inspection of a deep ultraviolet photomask (reticle) used as a light-projected master in a lithography process in the manufacture of semiconductors, and more particularly to a phase shift mask inspection apparatus for measuring the phase value of a phase shifter in a phase shift mask.

FIG. 8 shows the configuration of a phase shift mask inspection apparatus disclosed in Jpn. Pat. Appln. KOKAI Publication No. 4-151622.

The technique for finding the phase difference at the phase shift section (phase shifter) of the tested reticle has been written in Jpn. Pat. Appln. KOKAI Publication No. 4-151622.

The illumination light 2 emitted from an illumination light source 1 passes through an interference filter 3 and becomes monochromatic light having the same wavelength as that of exposure light used in the lithography process.

The light 2 passes through a polarizer 4 and becomes linearly polarized light, which is then divided by a crystal element (double refraction separation member) 5, such as a Nomarski prism or a Wollaston prism), into two luminous fluxes 2a, 2b differing in the direction of polarization of light.

These luminous fluxes 2a, 2b pass through a condenser lens 6 and illuminate a tested reticle 7 perpendicularly.

In the tested reticle 7, a transparent section 7a and a phase shift section (phase shifter) 7 are formed.

Of the two luminous fluxes 2a, 2b passed through the condenser lens 6, one luminous flux 2a passes through the transparent section 7a and the other 2b passes through the phase shifter 7b.

The two luminous fluxes 2a, 2b passed through the tested reticle 7 travel through an objective 8 and are recombined by a crystal element (double refraction separation member) 9, such as a Nomarski prism or a Wollaston prism.

The luminous flux 2 thus recombined passes through a compensator 10 and an analyzer 11 and is detected by a photoelectric sensor 12.

Interference occurs in the luminous flux 2 because, as described earlier, one luminous flux 2a has passed through the transparent section 7a while the other luminous flux 2b has passed through the phase shifter 7b.

The interference image 13 formed on an image surface varies with the phase difference between the two luminous fluxes 2a, 2b.

Therefore, a control section 14 takes in a signal corresponding to the intensity of interference outputted from the photoelectric sensor 12 and determines the phase difference at the phase shifter 7b on the basis of the signal.

The aforementioned technique, however, uses a lamp light source as the illumination light source 1, for example, and not a laser light source used to find the phase difference at the phase shifter 7b with high accuracy in the recent lithography processing.

When a laser light source is applied to the above technique, the laser light outputted from the laser light source is caused to pass through a diffusing filter so as to illuminate all of the tested reticle 7 uniformly.

Use of the diffusing filter permits speckles to take place in the two luminous fluxes 2a, 2b projected on the tested reticle 7.

This disturbs the intensity of the interference light, even when the two luminous fluxes 2a, 2b passed through the tested reticle 7 are recombined to cause interference. As a result, it is impossible to determine the phase difference at the phase shifter 7b with high accuracy.

BRIEF SUMMARY OF THE INVENTION

The object of the present invention is to provide a phase shift mask inspection apparatus with an improved reliability capable of measuring the phase value of a phase shifter by reducing the influence of speckles.

According a first aspect of the present invention, there is provided an apparatus for inspecting a phase shift mask, comprising: a laser light source for outputting laser light in a deep ultraviolet region; optical conversion means for converting the laser light outputted from the laser light source into light of a point source group consisting of a plurality of point sources; an illumination optical system for separating the light of the point source group into two polarized light beams shifted sideways and illuminating these polarized light beams onto a phase shift mask in which a phase shifter is formed; interference means for superimposing the two polarized light beams passed through the phase shift mask, one on the other, thereby causing the light beams to interfere with each other and providing interference light; phase-modulating means for changing a phase difference between the two polarized light beams, thereby to change the intensity of the interference light; and phase value computing means for calculating a phase value at the phase shifter formed in the phase shift mask, on the basis of the intensity of the interference light changed by the phase-modulating means.

According to a second aspect of the present invention, there is provided an apparatus for inspecting a phase shift mask, comprising: a laser light source for outputting laser light in a deep ultraviolet region; a diffusing optical system for converting the laser light outputted from the laser light source into diffused radiation light; moving means for moving the diffusing optical system in a specific direction with respect to an optical axis of the laser light; an illumination optical system for separating the diffused radiation light into two polarized light beams shifted sideways and illuminating these polarized light beams onto a phase shift mask in which a phase shifter is formed; interference means for superimposing the two polarized light beams passed through the phase shift mask, one on the other, thereby causing the light beams to interfere with each other and generating interference light; phase-modulating means for changing a phase difference between the two polarized light beams; and phase value computing means for calculating a phase value at the phase shifter formed in the phase shift mask, on the basis of the intensity of the interference light changed by the phase-modulating means.

According to a third aspect of the present invention, in the phase shift mask inspection apparatus, the laser light source outputs laser light with a central wavelength of 300 nm or less.

According to a fourth aspect of the present invention, in the phase shift mask inspection apparatus, the diffusing optical system is an optical system including a glass substrate having a diffusing surface formed on at least one side of the substrate.

According to a fifth aspect of the present invention, in the phase shift mask inspection apparatus, the moving means rotates, slides, or reciprocates the diffusing optical system with respect to the laser optical axis.

According to a sixth aspect of the present invention, in the phase shift mask inspection apparatus, the moving means is composed of a motor and a connection member that connects the axis of rotation of the motor to the center of rotation of the glass substrate, when the diffusing optical system is a glass substrate having a diffusing surface on at least one side of the substrate.

According to a seventh aspect of the present invention, in the phase shift mask inspection apparatus, the illumination optical system includes a polarizing beam splitter that separates light into two linearly polarized light beams having polarization planes crossing at right angles with each other.

According to an eighth aspect of the present invention, in the phase shift mask inspection apparatus, the sensing optical system includes a polarizing beam splitter that superimposes the two linearly polarized light beams passed through the phase shift mask on one another.

According to a ninth aspect of the invention, there is provided an apparatus of the type described above, in which the diffusing optical system is a glass substrate having a diffusing surface on one surface, the moving means rotates the glass substrate, and the phase value computing means comprises: first means for receiving the intensity of the interference light generated from the two light beams passed through the phase shift mask, after the phase-modulating means has changed the phase difference between the two polarized light beams; second means for obtaining a phase value of the phase shift mask on the basis of the intensity of the interference light supplied to the first means; third means for causing the first and second means to operate repeatedly, each time rotating the glass substrate through a different angle by the moving means, thereby calculating a plurality of phase value; and fourth means for averaging the plurality of phase value calculated by the third means.

According to a tenth aspect of this invention, there is provided an apparatus of the type described above, in which the diffusing optical system is a glass substrate having a diffusing surface on one surface, and the moving means moves the glass substrate, and the phase value computing means comprises: first means for receiving the intensity of the interference light generated from the two light beams passed through the phase shift mask, while the moving means is rotating the glass substrate, after the phase-modulating means has changed the phase difference between the two polarized light beams; and second means for obtaining a phase value of the phase shift mask on the basis of the intensity of the interference light supplied to the first means. Third means for causing the first and second means to operate repeatedly, each time rotating the glass substrate through a different angle, thereby calculating a plurality of phase value; and fourth means for averaging the plurality of phase value calculated by the third means.

According to an eleventh aspect of the invention, there is provided an apparatus of the type described above, which further comprises: a lamp light source for emitting light in a deep ultraviolet region; and exchanging means for exchanging the laser light outputted from the laser light source and the light emitted from the lamp light source and applying the light to the illumination optical system.

According to a twelfth aspect of the present invention, in the phase shift mask inspection apparatus, the lamp light source is a mercury-xenon lamp.

According to a thirteenth aspect of the present invention, in the phase shift mask inspection apparatus, the illumination optical system includes a first variable magnification optical system that varies the amount of sideways shift in the two polarized light beams shifted sideways, and the sensing optical system includes a second variable magnification optical system that reduces the sideways shift in the two polarized light beams passed through the phase shift mask by an amount equal to the sideways shift occurring in the illumination optical system.

According to a fourteenth aspect of the present invention, in the phase shift mask inspection apparatus, the first variable magnification optical system, when a pattern is formed repeatedly on the phase shift mask, varies the amount of sideways shift in the two polarized light beams so that the two polarized light beams may be shifted from the pitch of the repetition of the pattern.

According to a fifteenth aspect of the present invention, in the phase shift mask inspection apparatus, the light source outputs the light in a deep ultraviolet region having the same central wavelength as that of exposure light used in the lithography process with the mask.

According to a sixteenth aspect of the present invention, in the phase shift mask inspection apparatus, the light source outputs the light in a deep ultraviolet region having the central wavelength of 300 nm or less.

According to a seventeenth aspect of the present invention, in the method of inspecting a phase shift mask, comprising the steps of: converting a laser light outputted from a laser light source into light of a point source group consisting of a plurality of point sources;

separating the light of the point source group into two polarized light beams shifted sideways and illuminating these polarized light beams onto a phase shift mask in which a phase shifter is formed;

superimposing the two polarized light beams passed through the phase shift mask, one on the other, thereby causing the light beams to interfere with each other and generating interference light;

changing a phase difference between the two polarized light beams, thereby to change the intensity of the interference light; and calculating a phase value at the phase shifter formed in the phase shift mask on the basis of the intensity of the interference light.

According to an eighteenth aspect of the present invention, in the method of inspecting a phase shift mask, comprising the steps of: the laser light has a central wavelength of 300 nm or less.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION (1) Hereinafter, referring to the accompanying drawings, a first embodiment of the present invention will be explained.

Figure 1:
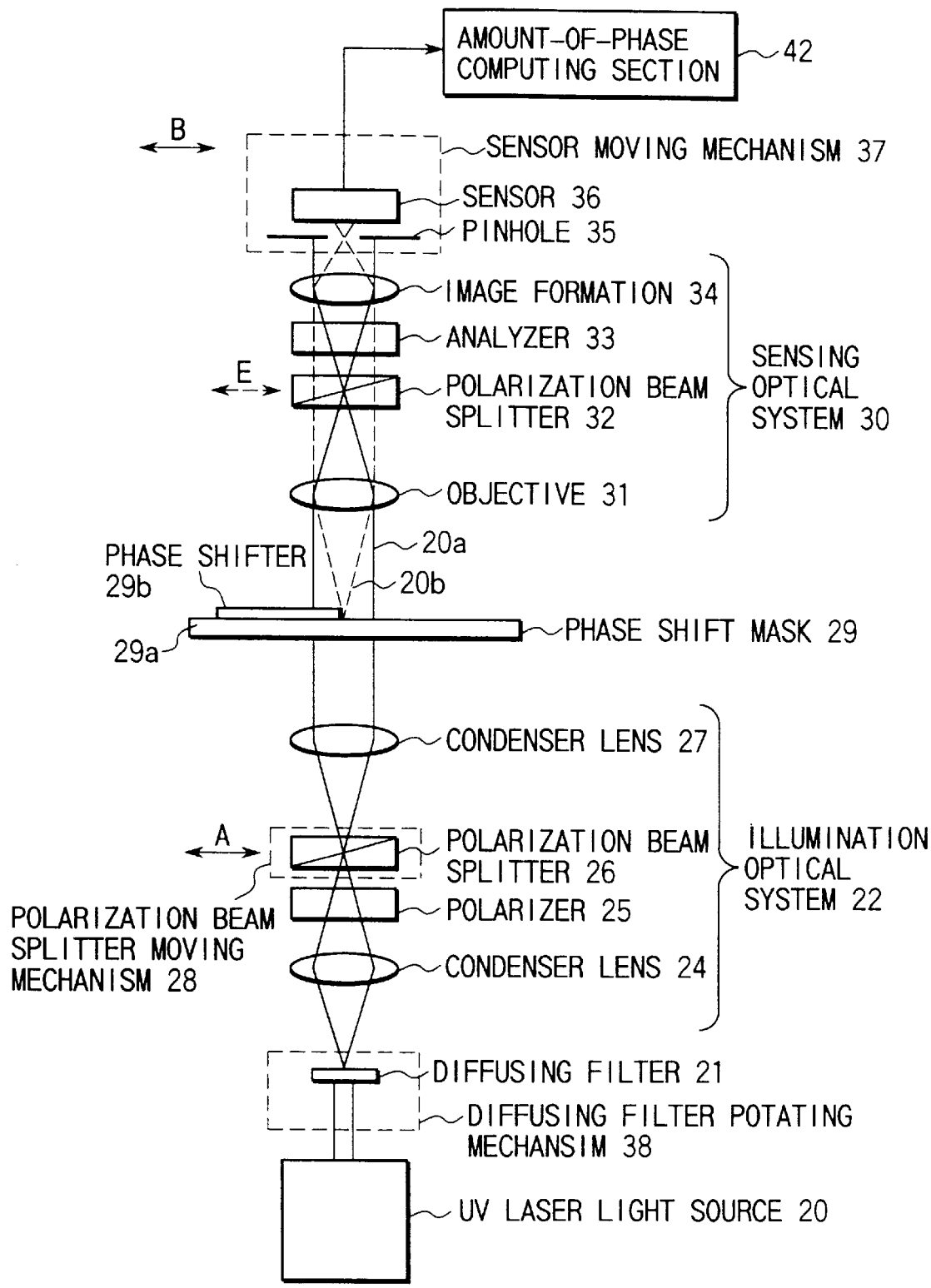
FIG. 1 shows the configuration of a phase shift mask inspection apparatus according to a first embodiment of the present invention.

FIG. 1 shows the configuration of a phase shift mask inspection apparatus.

A ultraviolet laser light source (hereinafter, referred to as a UV laser light source) 20 has the function of outputting laser light in a deep ultraviolet region with a central wavelength of 300 nm or less (hereinafter, referred to as UV laser light).

The UV laser light source 20 is an excima laser unit that outputs laser light with a central wavelength of 248 nm or 193 nm, for example.

On the optical path of the UV laser light outputted from the UV laser light source 20, a diffusing filter 21 and an illumination optical system 22 are provided.

The diffusing filter 21 can convert the UV laser light outputted from the UV laser light source 20 into a point source group consisting of a plurality of point sources. Namely, the diffusing filter 21 has the function of converting the UV laser light equivalently into a light source of diffuse radiation.

Figure 2:
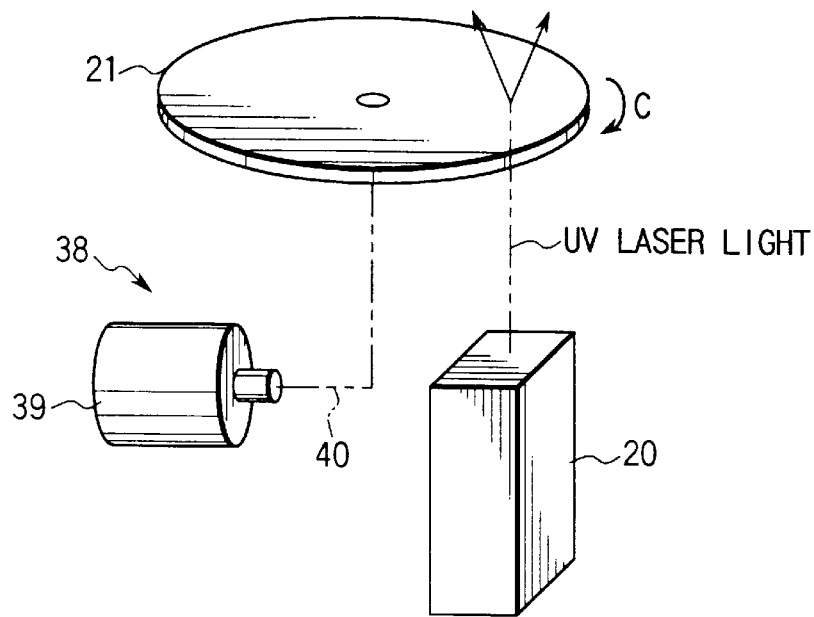
FIG. 2 shows the configuration of a diffusing filter and a diffusing filter rotating mechanism.

The diffusing filter 21 is formed into a disk-like shape as shown in FIG. 2. A glass substrate having a diffusing surface formed on one side, or a frosted glass, is used as the diffusing filter.

The illumination optical system 22 comprises a condenser lens 24, a polarizer 25, a polarizing beam splitter (PBS) 26 on the illumination optical system side, and a condenser lens 27—all provided on the optical path of the UV laser light.

The polarizing beam splitter 26 separates the UV laser light into two linearly polarized light beams that have polarization planes crossing at right angles with each other and has the function of emitting these two linearly polarized light beams as two illumination beams shifted sideways slightly on the same optical path.

The polarizing beam splitter 26 is provided in the polarizing beam splitter moving mechanism 28. The polarizing beam splitter moving mechanism 28 has the function of moving the polarized light splitter 26 in the direction (A) perpendicular to the optical axis of the UV laser light.

On the optical path of the two linearly polarized light beams outputted from the illumination optical system 22, a phase shift mask 29 is provided.

Figure 3:
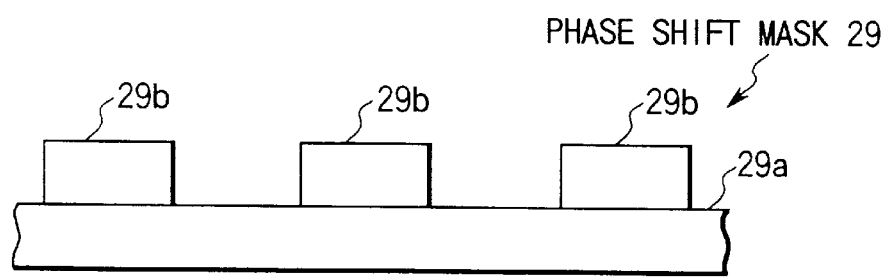
FIG. 3 shows the configuration of a phase shift mask.

The phase shift mask 29 is such that a phase shifter 29b that reverses the phase of light by 180° is formed at a glass substrate 29a as shown in FIG. 3. The phase shifter 29b is formed at the glass substrate 29a so as to have a specific pattern.

On the optical path of the two linearly polarized light beams passing through the phase shift mask 29, an objective 31, a polarizing beam splitter 32 on the sensing optical system side, an analyzer 33, and an image formation lens 34, all of which constitute a sensing optical system 30, are provided.

In the image formation position of the image formation lens 34, a sensor 36 such as a photomultiplier constituting amount-of-shift computing means is provided via a pinhole 35.

The polarizing beam splitter 32 has the function of superimposing the two linearly polarized light beams passed through the phase shift mask 29 on one another.

The sensor 36 has the function of receiving the interference light passing through the pinhole 35 from the image formation lens 34, photoelectrically converting the interference light, and outputting the voltage signal corresponding to the intensity of the interference light.

The sensor 36 is, for example, a photomultiplier or an ultraviolet CCD (charge-coupled device) camera.

A sensor moving mechanism 37 is used in the case where the sensor 26 is a photomultiplier. The mechanism 37 can move the pinhole 35 and the sensor 36 together in the direction (B) which is perpendicular to the axis of the UV laser light. Instead of using the mechanism, the phase shift mask 29 may be moved. The sensor moving mechanism 37 need not be used when the sensor 36 is an ultraviolet CCD camera.

The diffusing filter 21 is provided in the conjugate position with respect to the pupil of the condenser lens 27. The position of the diffusing filter 21 is not limited to the position conjugate to the pupil of the condenser lens 27.

The diffusing filter rotating mechanism 38 has the function of rotating the diffusing filter 21 in the direction of arrow (C) as shown in FIG. 2.

The diffusing filter rotating mechanism 38 includes a pulse motor 39 for rotating the diffusing filer 21 stepwise and a connection member 40 for connecting the axis of rotation of the pulse motor 39 to the center of rotation of the diffusing filter 21.

The diffusing filter 21 is provided so that the UV laser light outputted from the UV laser light source 20 may pass through the diffusing filter 21 at a position shifted in the direction of radius from the center of rotation of the diffusing filter 21.

The diffusing filter 21 may be rotated by a belt drive method.

Figure 4:
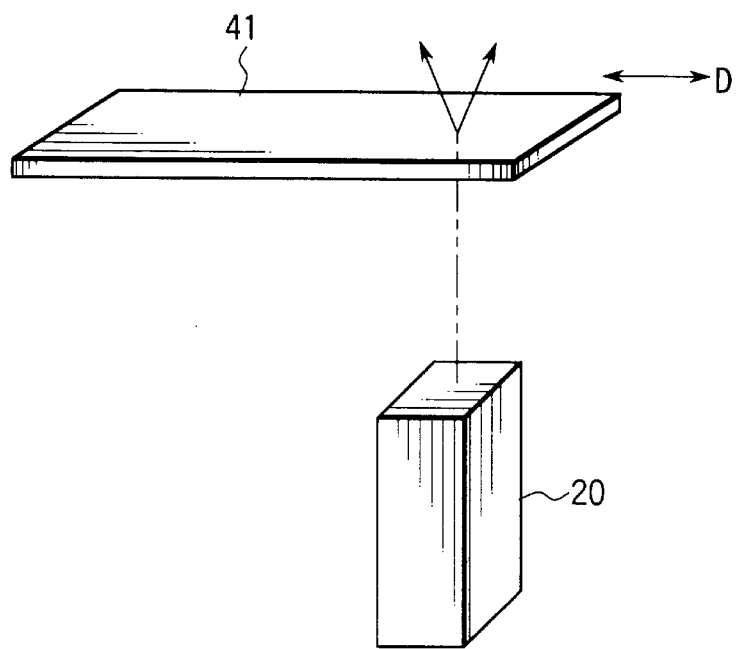
FIG. 4 shows the configuration of another diffusing filter.

The diffusing filter 21 may be a rectangular diffusing filter 41 as shown in FIG. 4, for example. In this case, the diffusing filter 41 is slid in the direction of arrow (D) with respect to the optical axis of the UV laser light.

Those diffusing filters 21, 41 may be reciprocated along the optical axis of the UV laser light.

The output terminal of the sensor 36 is connected to the phase value computing section 42.

The phase value computing section 42 is designed to calculate the phase value at the phase shifter 29b on the basis of the signal supplied from the sensor 36. The section 42 may calculate the phase value by, for example, averaging the phase value obtained from the intensity of the interference light produced every time the diffusing filter 21 is rotated through a prescribed angle. Alternatively, the section 42 may calculate the phase value from the intensity of the interference light produced while the diffusing filter 21 is being rotated.

The operation of the apparatus constructed as described above will be explained.

The UV laser light source 20 outputs UV laser light consisting of parallel rays with a central wavelength of 300 nm or less (e.g.,248 nm or 193 nm).

The diffusing filter 21 is rotated by the diffusing filter rotating mechanism 38.

The UV laser light passes through the rotating diffusing filer 21 and is converted into a light source of diffuse radiation. The resulting light enters the illumination optical system 22.

The rotation of the diffusing plate 21 changes the UV laser light in terms of speckle distribution. This randomizes the phase disorder of the interference light.

The UV laser light passes through the diffusing filter 21, which converts it into diffuse radiation.

The UV laser light travels through the interference filter 23, condenser lens 24, and polarizer 25.

The polarizer 25 extracts linearly polarized light rotated through a predetermined angle (e.g., 45°) with respect to the polarizing angle of the polarizing beam splitter 26, in a plane which is perpendicular to the axis of the UV laser light. The polarizer 25 need not be used when the predetermined angle is 0°, 90°, 180° or 270° and the beam splitter 26 does not split the incident light into two beams.

When receiving the linearly polarized light from the polarizer 25, the polarizing beam splitter 26 separates the light into two linearly polarized light beams having planes of polarization crossing at right angles with each other. In this case, these two separation angles are determined according to the angle of the laminating plane of the polarizing beam splitter 26.

Therefore, these two linearly polarized light beams make two illumination light beams slightly shifted from each other on the same optical path, which pass through the condenser lens 27, which then projects them as parallel light beams on the phase shift mask 29.

In FIG. 1, reference symbol 20a indicates the entire optical path of the two linearly polarized light beams passing through the phase shift mask 29 and 20b indicates the optical path of the light beam passing through a point on the phase shift mask 29.

The two light beams passing through the phase shift mask 29 goes through the objective 31 and enters the polarizing beam splitter 32 on the sensing optical system side.

The polarizing beam splitter 32 superimposes the linearly polarized light beam passed through the glass substrate 29a of the phase shift mask 29 on the other linearly polarized light beam passed through the phase shifter 29b.

The laminating plane of the polarizing beam splitter 32 is positioned so as to coincide with the pupil of the objective 31.

The two linearly polarized light beams superimposed by the polarizing beam splitter 32 pass through the analyzer 33, which puts their polarization planes together, thus causing interference.

The interference light passes through the image formation lens 34, which allows the light to go through the pinhole 35 and strike the sensor 36. On the sensing surface of the sensor 36, a sideways shifted interference image of the phase shift mask 29 is projected.

The sensor 36 outputs the voltage signal corresponding to the intensity of the incident interference light.

To measure the phase value of the phase shifter 29b, a phase shift interference method is used. Specifically, the polarizing beam splitter 26 is forced to move in the direction (A) perpendicular to the UV laser optical axis and the phase between the two linearly polarized light beams crossing at right angles with each other is modulated, which thereby produces a sinusoidal interference signal. From the interference signal obtained by both of the two polarized light beams passing through the glass substrate 29a, the phase value $\phi_{base}$ serving as a reference is found.

Next, the phase value $\phi_{edge}$ is found from the interference signal including information on the phase of the phase shifter 29b at the time when one of the polarized light beams has passed through the glass substrate 29a and the other has passed through the phase shifter 29b.

The phase value θ is found from the phase difference between them: $\phi_{base} - \phi_{edge}$ $\phi_{base}$ and $\phi_{edge}$ are calculated using phase modulated interference.

The interference signal that changes in a sinusoidal manner is divided into an N number of pieces, which are supplied to the sensor 36, which finds $\phi_{base}$ and $\phi_{edge}$ using equation (1):

$$\phi = -\tan^{-1} \frac{\sum_{i=0}^{N-1} Ii \cdot \sin\frac{2\pi}{N}i}{\sum_{i=0}^{N-1} Ii \cdot \cos\frac{2\pi}{N}i} \quad (1)$$

where N is an integer, $I_i$ is the interference signal, and $\phi$ is $\phi_{base}$ or $\phi_{edge}$.

Here, a single period of a sine wave is divided into an m number of equal parts and N=m×n (n is an integer) must hold.

The phase value θ is found using equation (2) on the basis of $\phi_{base}$ and $\phi_{edge}$:

$$\theta = \phi_{base} - \phi_{edge} \quad (2)$$

Influenced by the speckle noise, the phase value θ does not accurately represent the phase value of the phase shifter. The phase value computer section 42 calculates the phase value θ of the phase shifter, as will be described below.

The diffusing filter 21 is set in a stationary state, and the section 42 finds both $\phi_{base}$ and $\phi_{edge}$, calculating the phase value θ. The section 42 repeats this sequence M times, each time changing the position of the filter 21, thereby obtaining the sum $\theta_j$ of the phase value $\theta_j$ ($\theta_1 - \theta_M$, j=1 to M). The sum $\theta_j$ is divided by M, thus finding the average $\theta_0$ of the phase value of the phase shifter, i.e., $\eta_{j/M}$.

Alternatively, the phase value θ may be calculated by obtaining $\phi P_{base}$ and $\phi_{edge}$ while the diffusing plate 21 is being rotated. This method is advantageous because it can calculate θ within a short time. Still alternatively, this sequence may be repeated M times and the he sum of the phase value, obtained, may be divided by M, thereby calculating θ, in order to enhance the accuracy of measuring θ.

As described above, with the first embodiment, because the UV laser light outputted from the UV laser light source 20 is forced to pass through the diffusing filter 21 rotating around the optical axis of the UV laser light and reach the illumination optical system 22, the disorder of the phase of the interference light resulting from speckles caused by the stationary diffusing filter 21 can be randomized. This reduces speckles, improving the reliability with which the phase value θ of the phase shifter 29b can be measured with high accuracy.

Furthermore, because the two linearly polarized light beams separated by the polarizing beam splitter 26 are projected on the phase shift mask 29 as two illumination light beams slightly shifted sideways on the same optical path, there is no possibility that these two light beams will be influenced independently by air turbulence. Moreover, under the same air flow conditions, the beams can be projected on the phase shift mask 29, which enables a high-accuracy measurement of the phase value θ of the phase shifter 29b, improving the reliability of the measurement result.

Since the phase value of the phase shifter 29 can be measured with high accuracy, the quality of the phase shift mask 29 can be judged by comparing the measurement with the setting value of the phase shift mask 29. Furthermore, in phase shift exposure, a pattern can be transferred onto a semiconductor wafer with high accuracy, which improves the yield in the manufacture of semiconductors.

While the polarizing beam splitter 26 is moved in the direction (A) perpendicular to the optical axis of the UV laser, the present invention is not restricted to this. For instance, the polarizing beam splitter 32 on the sensing optical system side may be moved in the direction (E) perpendicular to the optical axis of the two linearly polarized light beams passed through the phase shift mask 29 to produce interference light.

Moreover, interference light may be produced by moving the polarizing beam splitter 26 on the illumination optical system side and the polarizing beam splitter 32 on the sensing optical system side mutually.

(2) Hereinafter, a second embodiment of the present invention will be explained by reference to the accompanying drawings.

Figure 5:
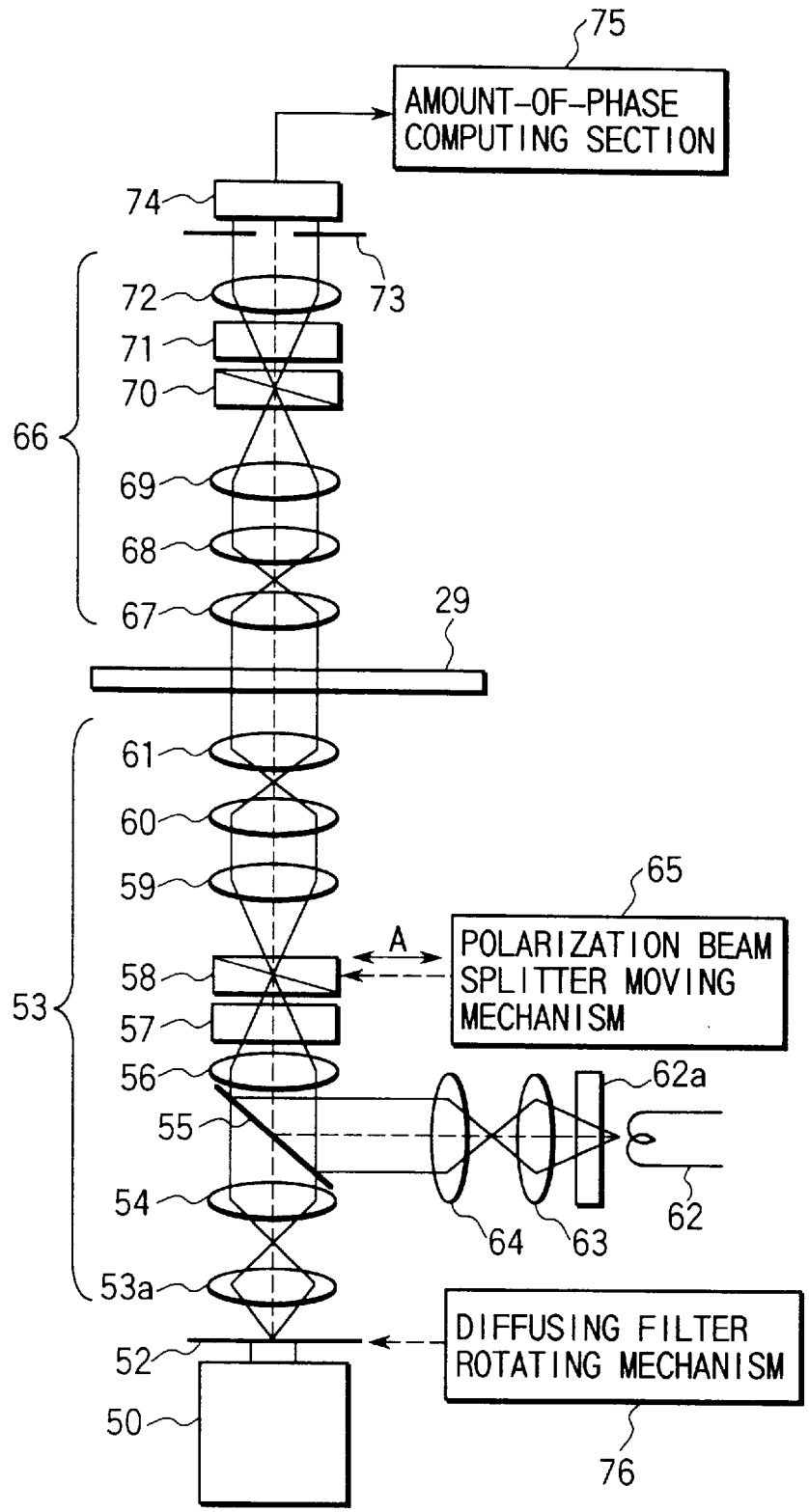
FIG. 5 shows the configuration of a phase shift mask inspection apparatus according to a second embodiment of the present invention.

FIG. 5 shows the configuration of a phase shift mask inspection apparatus.

A deep ultraviolet laser light source 50 is a KrF excima laser unit that outputs laser light with a central wavelength of 248 nm, for example.

On the optical path of the UV laser light outputted from the UV laser light source 50, an illumination optical system 53 is provided via a diffusing filter 52.

The diffusing filter 52 has the function of converting the UV laser light outputted from the UV laser light source 50 equivalently into a light source of diffuse radiation.

The illumination optical system 53 comprises optical lenses 53, 54, a half mirror 55, an optical lens 56, a polarizer 57, a Wollaston prism 58 as a polarizing beam splitter 58, optical lenses 59, 60, and a condenser lens 61.

There is provided an Hg—Xe lamp 62. The Hg—Xe lamp 62 emits deep ultraviolet rays of light with a central wavelength of 248 nm, for example. The rays are applied through an interference filter.

On the optical path of the lamp light outputted from the Hg—Xe lamp 50, the half mirror 55 is arranged via lenses 63, 64.

The half mirror 55 allows the UV laser light outputted from the UV laser optical source 50 or the lamp light outputted from the Hg—Xe lamp 50 to travel in the direction of the optical axis f of the illumination optical system 21, or allows the light to pass through the optical lens 56, polarizer 57, Wollaston prism 58, optical lenses 59, 60, and condenser lens 61 and strike a phase shift mask 29.

The UV laser light source 50 and Hg—Xe lamp 62 are switched according to two types of exposure unit.

The Wollaston prism 58 on the illumination optical system side separates the UV laser light into two linearly polarized light beams crossing at right angles with each other and has the function of emitting these two linearly polarized light beams as two illumination beams shifted slightly sideways on the same optical path.

A polarizing beam splitter moving mechanism 65 has the function of moving the Wollaston prism 58 in the direction (A) perpendicular to the optical axis of the UV laser light.

On the optical path of the light passing through the phase shift mask 29, the sensing optical system 66 is provided.

The sensing optical system 66 comprises an objective 67, optical lenses 68, 69, a Wollaston prism 70 acting as a polarizing beam splitter, an analyzer 71, and an optical lens 72.

The Wollaston prism 70 has the function of superimposing the two linearly polarized light beams passed through the phase shift mask 29 on one another.

On the optical path of the light passing through the optical lens 72, a sensor 74 constituting amount-of-shift computing means is provided via a pinhole 73.

The sensor 74 has the function of outputting the voltage signal corresponding to the intensity of the incident interference light. The sensor 74 is placed in the image formation position of the optical lens 72. A photomultiplier sensor or an ultraviolet CCD camera is used as the sensor 74, for example.

The output signal from the sensor 74 is sent to the phase value computing section 75.

The phase value computing section 75 has the function of receiving the voltage signal from the sensor 74 and calculating the phase value of the phase shifter 29a in the phase shift mask 29 on the basis of the intensity of interference light.

The diffusing filter 52 is connected to the diffusing filter rotating mechanism 76.

Like the configuration of FIG. 2, the diffusing filter rotating mechanism 76 includes a pulse motor 39 for rotating the disk-like diffusing filer 52 stepwise and a connection member 40 for connecting the axis of rotation of the pulse motor 39 to the center of rotation of the diffusing filter 21.

The operation of the apparatus constructed as described above will be explained.

First, the UV laser light source 50 emits UV laser light.

The diffusing filter 52 is being rotated by the diffusing filter rotating mechanism 76.

The diffusing filter 52 converts the UV laser light equivalently into a light source of diffuse radiation. The resulting light passes through the optical lenses 53, 54 and reaches the half mirror 55. Then, it passes through the optical lens 56 and enters the polarizer 57.

The polarizer 57 extracts linearly polarized light rotated through a predetermined angle (e.g., 45°) with respect to the polarizing angle of the Wollaston prism 58 provided on the illumination optical system side, in a plane which is perpendicular to the optical axis f. The predetermined angle may be adjusted, if necessary, in order to increase the contrast of the signal representing the interference occurring at the interface between the glass substrate and the phase shifter section.

The Wollaston prism 58 separates the UV laser light into two linearly polarized light beams crossing at right angles with each other.

These two linearly polarized light beams pass through the optical lenses 59, 60 and condenser lens 61 and strike the phase shift mask 29.

One of the two linearly polarized light beams crossing at right angles passes through the glass substrate 29a of the phase shift mask 29 and the other passes through the phase shifter 29b.

The two light beams passed through the phase shift mask 29 pass through the objective 67 and optical lenses 68, 69 and enter the Wollaston prism 72 on the sensing optical system side.

The Wollaston prism 72 superimposes the light passed through the glass substrate 29a of the phase shift mask 29 on the light passed through the phase shifter 29b.

After the two light beams superimposed on one another pass through the analyzer 71, they interfere with each other.

The interference light passes through the optical lens 72 and pinhole 73 and strikes the sensor 74.

Because one of the two linearly polarized light beams crossing at right angles has passed through the glass substrate 29a of the phase shift mask 29 and the other has passed through the phase shifter 29b, the interference light incident on the sensor 74 has an intensity of interference corresponding to the phase value of the phase shifter 29b.

The sensor 36 generates a voltage signal which corresponds to the intensity of the incident interference light. To measure the phase value of the phase shifter 29b, phase-shift interference method is carried out, by moving the beam splitter 26 in the vertical direction (A) which is perpendicular to the axis of the UV laser light. The phase difference between two linear polarized light beams which are perpendicular to each other is modulated, thereby generating a sinosoidal interference signal. A reference phase value $\phi_{base}$ is obtained from the interference signal generated when the two polarized light beams pass through the glass substrate 29a. Further, a phase value $\phi_{edge}$ is obtained from the interference signal which represents the phase the phase shifter has when the polarized light beams pass through the glass substrate 29a and the phase shifter 29b, respectively. The phase value of the phase shifter is calculated from the phase difference between the phase value $\phi_{base}$ and $\phi_{edge}$, i.e., $\phi_{base}-\phi_{edge}$.

Both $\phi_{base}$ and $\phi_{edge}$ are obtained by fringe scanning interference method. More precisely, the sinosoidal interference signal is divided by N, providing N segment signals. These segment signals are supplied to the sensor 36, and $\phi_{base}$ and $\phi_{edge}$ are calculated as is indicated by the above equation (1) given above. The phase value θ is calculated from $\phi_{base}$ and $\phi_{edge}$ as is shown in the above equation (2).

The lamp light outputted from the Hg—Xe lamp 62 passes through the optical lenses 63, 64, half mirror 55, and optical lens 56 and strikes the polarizer 57.

The polarizer 57 extracts the linearly polarized light rotated through 45° in a plane perpendicular to the polarizing angle of the Wollaston prism 58 on the illumination optical system side and the optical axis f.

The Wollaston prism 58 separates the lamp light into two linearly polarized light beams crossing at right angles with each other.

These two light beams make two illumination light beams slightly shifted sideways and pass through the optical lenses 59, 60 and condenser lens 61 and strike the phase shift mask 29.

In the vicinity of the pattern boundary (i.e., the interface between the glass substrate 29a and the phase shifter 29b), one of the two linearly polarized light beams crossing at right angles passes through the glass substrate 29a of the phase shift mask 29, and the other passes through the phase shifter 29b.

The two light beams passed through the phase shift mask 29 pass through the objective 67 and optical lenses 68, 69 and enter the Wollaston prism 72 on the sensing optical system side.

The Wollaston prism 72 superimposes the light passed through the glass substrate 29a of the phase shift mask 29 on the light passed through the phase shifter 29b.

After the two light beams superimposed on one another pass through the analyzer 71, they interfere with each other.

The interference light passes through the optical lens 72 and pinhole 73 and strikes the sensor 74.

The sensor 36 generates a voltage signal which corresponds to the intensity of the incident interference light. In order to measure the phase value of the phase shifter 29b, phase-shift interference method is carried out, by moving the beam splitter 26 in the vertical direction (A) which is perpendicular to the axis of the UV laser light. The phase difference between two linear polarized light beams which are perpendicular to each other is modulated, thereby generating a sinosoidal interference signal. A reference phase value $\phi_{base}$ is obtained from the interference signal generated when the two polarized light beams pass through the glass substrate 29a. Further, a phase value $\phi_{edge}$ is obtained from the interference signal which represents the phase the phase shifter has when the polarized light beams pass through the glass substrate 29a and the phase shifter 29b, respectively. The phase value of the phase shifter is calculated from the phase difference between the phase value $\phi_{base}$ and $\phi_{edge}$, i.e., $\phi_{base}-\phi_{edge}$.

Both $\phi_{base}$ and $\phi_{edge}$ are obtained by fringe scanning interference method. More precisely, the sinosoidal interference signal is divided by N, providing N segment signals. These segment signals are supplied to the sensor 36, and $\phi_{base}$ and $\phi_{edge}$ are calculated as is indicated by the above equation (1) given above. The phase value θ is calculated from $\phi_{base}$ and $\phi_{edge}$ as is shown in the above equation (2).

The phase value θ is influenced by the speckle noise and does not accurately represent the phase value of the phase shifter. The phase value computer section 42 calculates the phase value θ of the phase shifter, as will be described below.

The diffusing filter 21 is set in a stationary state, and the section 42 finds both $\phi P_{base}$ and $\phi_{edge}$ calculating the phase value θ. The section 42 repeats this sequence M times, each time changing the position of the filter 21, thereby obtaining the sum $\theta_j$ of the phase value $\theta_j$ ($\theta_1-\theta_M$, j=1 to M). The sum $\theta_j$ is divided by M, thus finding the average $\theta_0$ of the phase value of the phase shifter, i.e., $\eta_j/M$.

Alternatively, the phase value θ may be calculated by obtaining $\phi P_{base}$ and $\phi_{edge}$ while the diffusing plate 21 is being rotated. This method is advantageous because it can calculate θ within a short time. Still alternatively, this sequence may be repeated M times and the he sum of the phase value, obtained, may be divided by M, thereby calculating θ, thereby to enhance the accuracy of measuring θ.

With the second embodiment, since the UV laser light outputted from the UV laser light source 50 is forced to pass through the diffusing filter 52 rotating around the optical axis of the UV laser light and is supplied to the illumination optical system 53, it is possible to randomize the disorder of the phase of interference light resulting from speckles caused by the stationary diffusing filter 52, which reduces speckles, thereby improving the reliability with which the phase value θ of the phase shifter 29b can be measured with high accuracy.

Because the light source is switched between the UV laser light source 50 and Hg—Xe lamp 62, either the UV laser light source 50 or the Hg—Xe lamp 62 is used according to two types of exposure unit. The phase value θ of the phase shifter 29b of the phase shift mask 29 can be found using the same light source as that of the exposure unit.

An ArF laser (with a wavelength of 193 nm), for example may be used as a light source. Any light source may be used as long as it can serve to achieve light exposure using a mask.

It is very important to use the deep ultraviolet light having the same central wavelength as that of exposure light used in the lithography process with said mask because in the deep ultraviolet region the refraction index changes very sensitively so that the phase value changes also very sensitively. When the deep ultraviolet light having the different central wavelength from that of the exposure light is used, it would be very hard to get the precise phase value of the mask. The preferable central wavelength of the light is 300 nm or less.

While to measure the phase value of the phase shifter 29b, the polarizing beam splitter 58 is moved in the direction (A) perpendicular to the optical axis of the UV laser, the present invention is not restricted to this. For instance, the polarizing beam splitter 70 on the sensing optical system side may be moved in the direction perpendicular to the optical axis of the two linearly polarized light beams passed through the phase shift mask 29 to produce interference light.

Moreover, interference light may be produced by moving the polarizing beam splitter 58 on the illumination optical system side and the polarizing beam splitter 70 on the sensing optical system side mutually.

(3) Hereinafter, a third embodiment of the present invention will be explained by reference to the accompanying drawings. The same parts as those in FIG. 5 are indicated by the same reference symbols and a detailed explanation of them will not be given.

Figure 6:
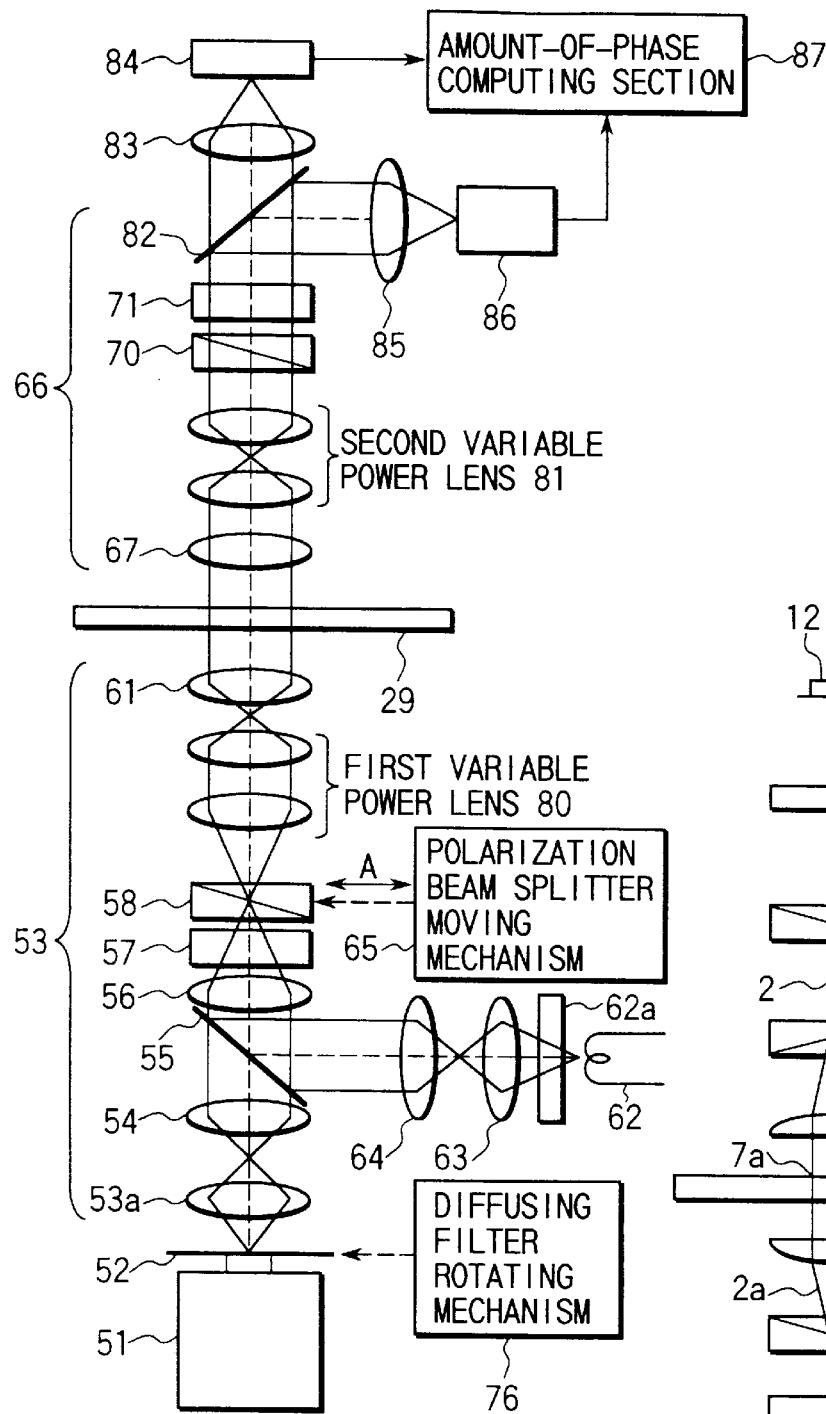
FIG. 6 shows the configuration of a phase shift mask inspection apparatus according to a third embodiment of the present invention.
Figure 8:
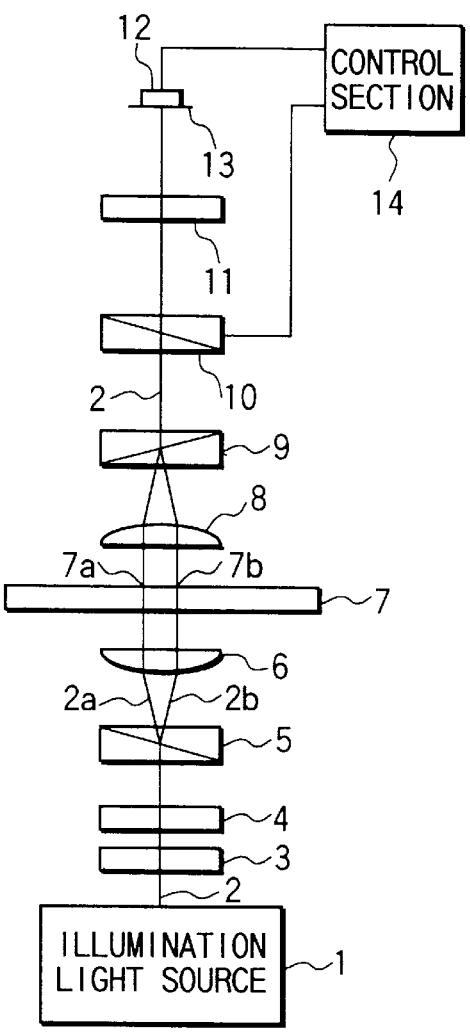
FIG. 8 shows the configuration of a conventional phase shift mask inspection apparatus.

FIG. 6 shows the configuration of a phase shift mask inspection apparatus.

On the optical path between a first polarizing beam splitter 58 and a condenser lens 61, a first variable power lens 80 serving as a first variable magnification optical system is provided.

The first variable power lens 80 has the function of varying the amount of sideways shift of each ultraviolet light beam or each UV laser beam of the polarized light beams in two directions shifted sideways by the polarizing beam splitter 58.

The amount of sideways shift of the polarized light beams in two directions is determined by the separation angle of the polarized light beams in two directions at the polarizing beam splitter 58 and the focal length of the condenser lens 61. The first variable power lens 80 has the function of varying the amount of sideways shift arbitrarily.

For example, the amount of sideways shift is equal to the difference from the width of the phase shifter 29b formed in the phase shift mask 29 or to the difference from the pattern pitch width in a case where a plurality of phase shifters 29 are arranged.

On the optical path between an objective 67 and a polarizing beam splitter 70, a second variable power lens 81 serving as a second variable magnification optical system is provided.

The second variable power lens 81 is formed of a variable magnification zoom lens, for example. The second variable power lens 81 has the function of returning the amount of sideways shift of each deep ultraviolet light beam or each UV laser light beam of the polarized light beams in two directions passed through the phase shift mask 29 to the amount of sideways shift before the first variable power lens 80 has changed the magnification.

That is, the second variable power lens 81 has the function of returning the amount of sideways shift by the amount equal to the amount of sideways shift caused at the first variable power lens 58.

The beam splitter 82 has the function of separating the UV laser light from the analyzer 71 or the lamp light into light beams in two directions.

In one separate direction of the beam splitter 82, an ultraviolet camera 84 is provided via a lens 83. In the other separate direction, a sensor 86 is provided via a lens 85. A photomultiplier sensor or an ultraviolet CCD camera is used as the sensor 86, for example.

The phase value computing section 87 takes in the image data from the ultraviolet camera 84 or the voltage signal outputted from the sensor 86, and calculates the phase value of the phase shifter 296 in the phase shift mask 29 by a phase shift interference method as described above, that is, on the basis of the ntensity of interference at the time when the polarizing beam splitter 58 or 70 is moved in the direction (A) perpendicular to the UV laser optical axis and the phase between the two linearly polarized light beams crossing at right angles with each other is modulated.

The operation of the apparatus constructed as described above will be explained.

First, the UV laser light source 50 emits UV laser light.

The diffusing filter 52 is rotated by the diffusing filter rotating mechanism 76.

The diffusing filter 52 converts the UV laser light equivalently into a light source of diffuse radiation. The resulting light passes through the optical lenses 53, 54 and reaches the half mirror 55. Then, it passes through the optical lens 56 and enters the polarizer 57.

The polarizer 57 extracts the linearly polarized light rotated through 45° in a plane perpendicular to the polarizing angle of the Wollaston prism 58 on the illumination optical system side and the optical axis f.

The Wollaston prism 58 separates the UV laser light into two linearly polarized light beams crossing at right angles with each other.

These two linearly polarized light beams enter the first variable power lens 80.

The first variable power lens 80 magnifies the two linearly polarized light beams variably. For instance, the two linearly polarized light beams are shifted sideways by the amount equal to the difference from the width of the phase shifter 29b formed in the phase shift mask 29 or by the amount equal to the difference from the pattern pitch width in a case where a plurality of phase shifters 29b are arranged repeatedly in the phase shift mask 29.

The two linearly polarized light beams shifted sideways pass through the condenser lens 61 and strike the phase shift mask 29.

One of the two linearly polarized light beams passes through the glass substrate 29a and the other passes through both of a part of the glass substrate 29a and a part of the phase shifter 29b.

The two linearly polarized light beams passed through the phase shift mask 29 pass through the objective 67 and enter the second variable power lens 81.

The second variable power lens 81 returns the amount of sideways shift in the two linearly polarized light beams to the amount equal to the amount of sideways shift before the first variable power lens 80 has varied the magnification. For example, if the first variable power lens 80 will magnify the light beams A times, the second variable power lens 81 magnifies them YA times.

The two linearly polarized light beams passed through the second variable power lens 81 enter the polarizing beam splitter 70. The polarizing beam splitter 70 superimposes the two linearly polarized light beams whose amount of sideways shift by the polarizing beam splitter 58 has been returned to the original one.

When the two linearly polarized light beams are superimposed on one another, the laser beams passed through the part of the glass substrate 29a interfere with each other and the UV laser beams passed through both of the part of the glass substrate 29a and the part of the phase shifter 29b interfere with one another.

The interference light passes through the diffusing filter 71 and reaches the beam splitter 82, which branches it into beams in two directions. One of them passes through the lens 83 and is sent to the ultraviolet camera 84 and the other passes through the lens 85 and is sent to the sensor 86.

When the polarizing beam splitter 58 is moved in the direction (A) perpendicular to the optical axis, the phase difference between the two linearly polarized light beams varies, resulting in a change in the intensity of interference.

The phase value computing section 87 takes in the image data from the ultraviolet camera 84 or the voltage signal outputted from the sensor 86, senses the change of the interference intensity, while moving the position of the polarizing beam splitter 58, and measures the phase value of the phase shifter 29b by a phase shift interference method.

The lamp light outputted from the Hg—Xe lamp 62 passes through the optical lenses 63, 64, half mirror 55, optical lens 56, and polarizer 57 and enters the Wollaston prism 58 on the illumination optical system side.

The Wollaston prism 58 separates the lamp light into two linearly polarized light beams crossing at right angles with each other.

The first variable power lens 80 variably magnifies the two linearly polarized light beams crossing at right angles as described above.

The two linearly polarized light beams pass through the condenser lens 61 and strike the phase shift mask 29.

The two linearly polarized light beams passed through the phase shift mask 29 pass through the objective 67 and enter the second variable power lens 81.

The second variable power lens 81 returns the amount of sideways shift in the two linearly polarized light beams to the amount equal to the amount of sideways shift before the first variable power lens 80 has varied the magnification.

The two linearly polarized light beams passed through the second variable power lens 81 enter the polarizing beam splitter 70. The polarizing beam splitter 70 superimposes the two linearly polarized light beams on one another.

Thereafter, when the polarizing beam splitter 58 is moved in the direction (A) perpendicular to the optical axis, the phase difference between the two linearly polarized light beams varied, resulting in a change in the intensity of interference.

The phase value computing section 87 takes in the image data from the ultraviolet camera 84 or the voltage signal outputted from the sensor 86, senses the change of the interference intensity, while moving the position of the polarizing beam splitter 58, and measures the phase value of the phase shifter 29b by a phase shift interference method.

With the third embodiment, since the UV laser light outputted from the UV laser light source 50 is forced to pass through the diffusing filter 52 rotating around the optical axis of the UV laser light and is supplied to the illumination optical system 53, it is possible to randomize the disorder of the phase of interference light resulting from speckles caused by the stationary diffusing filter 52, which reduces speckles, thereby improving the reliability with which the phase value θ of the phase shifter 29b can be measured with high accuracy.

Because the first variable power lens 80 and second variable power lens 81 are provided, the amount of sideways shift in the two linearly polarized light beams or of the lamp light projected on the phase shift mask 29 can be magnified variably according to the width in the phase shifter 29b formed in the phase shift mask 29 or the pattern pitch width with which a plurality of phase shifters 29 are arranged repeatedly.

This allows not only the lamp beams or the laser beams passed through the part of the glass substrate 29a in the phase shift mask 29 to interfere with each other but also the lamp beams or the UV laser beams passed through both of the glass substrate 29a and the phase shifter 29b to interfere with one another, which enables the phase value of the phase shifter 29b to be measured with high accuracy.

The measurement of the phase value of the phase shifter 29b with high accuracy enables a mask pattern to be transferred onto a semiconductor wafer with a high resolution in exposing a pattern on the semiconductor wafer using the phase shift mask 29, which helps produce a submicroscopic pattern.

The third embodiment may be modified as follows.

For example, while the first and second variable magnification optical systems use zoom lenses, the present invention is not limited to this. For instance, a plurality of lenses differing in magnification may be provided and the amount of sideways shift in the UV laser beams or lamp light beams of the two linearly polarized light beams may be magnified variably by exchanging between these lenses.

Furthermore, the amount of sideways shift in the first variable magnification optical system may be increased or decreased so that the interference between the light beams passed through the glass substrate 29a in the phase shift mask 29 may take place at least to the extent equal to the resolution of the apparatus.

Moreover, the polarizing beam splitter is not limited to a Wollaston prism. For instance, any optical system that converts UV laser light or lamp light into UV laser light or lamp light of polarized light beams in two direction shifted sideways may be used.

(4) Hereinafter, a fourth embodiment of the present invention will be explained by reference to the accompanying drawings.

Figure 7:
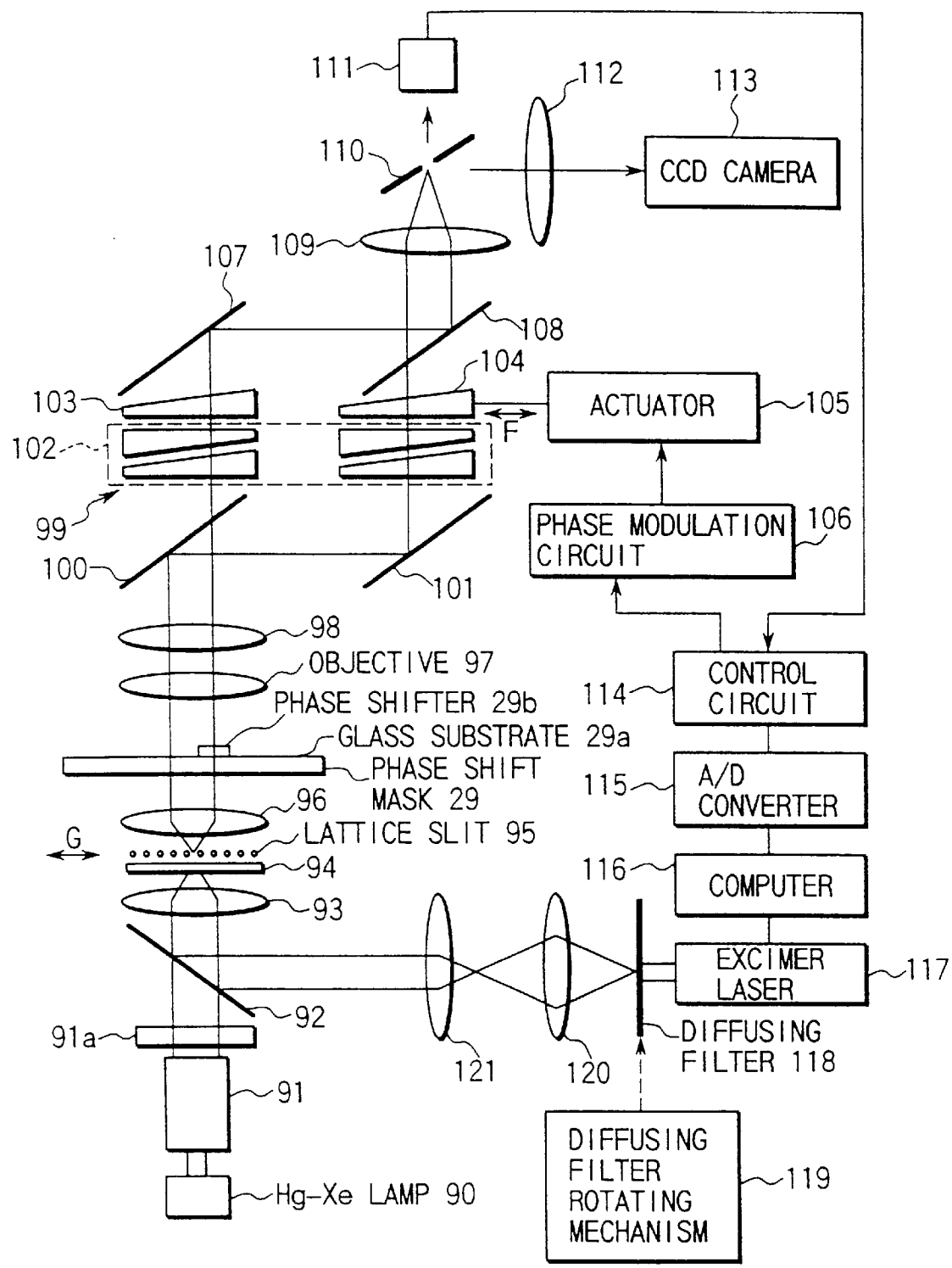
FIG. 7 shows the configuration of a phase shift mask inspection apparatus according to a fourth embodiment of the present invention.

FIG. 7 shows the configuration of a phase shift mask inspection apparatus.

An Hg—Xe lamp 90 emits lamp light with a central wavelength of 248 nmm, for example.

Quartz optical fiber 91 is connected to the Hg—Xe lamp 90.

On the optical path of the lamp light emitted from the emission end of the quartz optical fiber 91, an exchanging mirror 92, a condenser lens 93, an interference filter 94, a lattice slit 95, and a condenser lens 96 are provided.

In the position at which the condenser lens 96 projects light, a phase shift mask 29 is provided.

On the optical path of the light passed through the phase shift mask 29, a Mach-Zehnder interferometer 99 is provided via an objective 97 and a relay lens 98.

In the Mach-Zehnder interferometer 99, a half mirror 100 is placed on the optical path of the light passing through the relay lens 98 and a mirror 101 is place on the optical path of the light branched by the half mirror 100.

On the optical path of the light passing through the half mirror 100, an optical path length adjusting prism 103 serving as a phase modulation circuit 102 is placed. On the optical path of the light reflected by the mirror 101, a phase modulation prism 104 acting as the phase modulation circuit 102 is placed.

An actuator 105 is connected to the phase modulation prism 104. The actuator 105 has the function of moving the phase modulation prism 104 in the direction perpendicular to the optical axis, or in the direction of arrow (F), under the direction of the phase modulation circuit 106.

On the optical path of the light passed through the optical path length adjusting prism 103, a mirror 107 is provided. On the optical path of the light reflected by the mirror 107 and on the optical path of the light passed through the phase modulation prism 104, a half mirror 108 is provided.

On the optical path of the light reflected by the half mirror 108, a sensor 111 is provided via a lens 109 and a pinhole mirror 110.

The sensor 111 is a photomultiplier sensor or an ultraviolet CCD camera, for example.

On the optical path of the light reflected by the pinhole mirror 110, a CCD camera 113 is provided via a relay lens 112 to observe the measurement position.

A control circuit 114 is connected to the output terminal of the sensor 111. A computer 116 is connected via an A/D converter 115 to the control circuit 114.

An excimer laser oscillator 117 has the function of outputting UV laser light with a central wavelength of 248 nm or 193 nm, for example.

On the optical path of the UV laser light outputted from the excimer laser oscillator 117, a diffusing filter 118 is provided.

The diffusing filter 118 is rotated by a diffusing filter rotating mechanism 119. Like the configuration of FIG. 2, the diffusing filter rotating mechanism 119 comprises a pulse motor 39 for rotating the disk-like diffusing filter 118 stepwise and a connection member 40 for connecting the axis of rotation of the pulse motor 39 to the center of rotation of the diffusing filter 21.

On the optical path of the light passed through the diffusing filter 118, the exchanging mirror 92 is provided via optical lenses 120, 121.

The exchanging mirror 92 has the function of exchanging between the UV laser light passed through the diffusing filter 118 and the lamp light emitted from the Hg—Xe lamp 90 and transmitting it to the lattice slit 95.

The computer 116 has the function of giving the control circuit 114 an instruction to move the phase modulation prism 104 when the Hg—Xe lamp 90 is turned on, taking in each interference signal from the sensor 111 digitized by the A/D converter 115 each time the phase modulation prism 104 moves, and calculating the phase value of the phase shifter 29b on the basis of the interference signals.

The computer 116 has the function of giving the control circuit 114 an instruction to move the phase modulation prism 104 when the excimer laser oscillator 117 is operated, taking in each interference signal from the sensor 111 digitized by the A/D converter 115 each time the phase modulation prism 104 moves, and calculating the phase value of the phase shifter 29b on the basis of the interference signals Namely, the computer 116 has the function of taking in the interference signal outputted from the sensor 111 when both of the two laser light beams shifted sideways by the lattice slit 95 have passed through the glass substrate 29a of the phase shift mask 29 and calculating the phase value $\phi_{base}$ serving as a reference from the interference signal.

The computer 116 has the function of taking in the interference signal including information on the phase of the phase shifter 29b outputted from the sensor 111 at the time when one of the two UV laser beams shifted sideways by the lattice slit 95 has passed through the glass substrate 29a and the other UV laser beam has passed through the phase shifter 29b, and of calculating the phase value $\phi_{edge}$ from the interference signal.

Specifically, the computer 116 moves the phase modulation prism 104 in the direction (F) perpendicular to the optical axis in steps of a constant movement, takes in each interference signal from the sensor 111 each time the phase modulation prism 104 moves, divides the sinusoidal interference signal into an N number of equal parts, and calculates the phase value $\phi_{base}$, $\phi_{edge}$ using equation (1).

The computer 116 has the function of finding the phase value θ of the phase shifter 29b from the phase value $\phi_{base}$, $\phi_{edge}$ calculated using equation (1):

$$\theta = \phi_{base} - \phi_{edge} \tag{3}$$

The computer 116 has the function of finding the phase value of the phase shifter 29b as described above each time the diffusing filter 118 is rotated stepwise and calculating the phase value $\theta_0$ of the phase shifter 29b by averaging the sum total of the phase value over the number of times that the diffusing filter 118 was rotated stepwise.

The operation of the apparatus constructed as described above will be explained.

Measuring the Phase Value Using Hg—Xe Lamp 90.

The lamp light outputted from the Hg—Xe lamp 90 is directed by the quartz optical fiber 91 and passes through the exchanging mirror 92, condenser lens 93, and interference filter 94, and enters the lattice slit 95.

The lamp light is divided by the lattice slit 95 into two lamp light beams. One of the lamp light beams goes from the condenser lens 96 and passes through the glass substrate 29a of the phase shift mask 29. The other lamp light beam goes from the condenser lens 96 and passes through part of the phase shifter 29b of the phase shift mask 29.

These lamp light beams pass through the objective 97 and relay lens 98 and reaches the half mirror 100.

The lamp light beam passed through the glass substrate 29a of the phase shift mask 29 is reflected by the half mirror 100 and mirror 101 and passes through the phase modulation prism 104 and reaches the half mirror 108.

The lamp light beam passed through the phase shifter 29b of the phase shift mask 29 passes through the half mirror 100 and optical path length adjusting prism 103 and is reflected by the mirror 107 and reaches the half mirror.

The lamp light beam passed through the glass substrate 29a and the lamp light beam passed through the phase shifter 29b strike the half mirror 108, which combines them, resulting in interference.

The interference light passes through the lens 109 and pinhole mirror 110 and strikes the sensor 111.

The sensor 111 outputs the voltage signal corresponding to the light intensity of the interference light. The voltage signal is sent via the control circuit 114 to the A/D converter 115, which digitizes the signal and supplies the resulting signal to the computer 116.

The computer 116 gives the control circuit 114 an instruction to move the phase modulation prism 104. The actuator 105 moves the phase modulation prism 104 in the direction (F) perpendicular to the optical axis.

The computer 116 takes in each voltage signal from the sensor 111 digitized by the A/D converter 115 each time the phase modulation prism 104 moves and calculates the phase value of the phase shifter 29b on the basis of the voltage signals.

To measure the Phase Value Using the excimer Laser Oscillator 117, the oscillator 117 is driven outputting parallel rays of UV laser light.

The diffusing filter 118 is rotated by the diffusing filter rotating mechanism 119.

The UV laser light outputted from the excimer laser oscillator 117 is diffused by the diffusing filter 118. The resulting light passes through the lenses 120, 121 and strikes the exchanging mirror 92, which reflects it. The reflected light passes through the condenser lens 93 and interference filter 94 and enters the lattice slit 95.

The UV laser light is divided into two UV laser light beams shifted sideways by the lattice slit 95. The two light beams pass through the condenser lens 96 and are projected on the phase shift mask 29.

At this time, when the lattice slit 95 is moved in the direction (G) perpendicular to the optical path of the UV laser light and the optical path length is modulated by the optical path length adjusting prism 103 of the Mach-Zehnder interferometer 99, the sensor 111 outputs a sinusoidal interference signal.

One of the two UV laser beams shifted sideways by the lattice slit 95 goes from the condenser lens 96 and passes through the glass substrate 29a of the phase shift mask 29 and the other UV laser beam goes from the condenser lens 96 and passes through the phase shifter 29b.

The UV laser beam passed through the glass substrate 29a and the UV laser beam passed through the phase shifter 29b pass through the objective 97 and relay lens 98 and enter the Mach-Zehnder interferometer 99.

The Mach-Zehnder interferometer 99 reflects the UV laser beam passed through the glass substrate 29 a at the half mirror 100 and mirror 101 so as to cause the beam to pass through the phase modulation prism 104 and reach the half mirror 108.

At the same time, the Mach-Zehnder interferometer 99 causes the UV laser beam passed through the phase shifter 29b to pass through the half mirror 100 and the optical path length adjusting prism 103, be reflected by the mirror 107, and be sent to the half mirror 108.

The UV laser beam passed through the glass substrate 29a and the UV laser beam passed through the phase shifter 29b strike the half mirror 108, which combines them, resulting in interference.

The interference light passes through the lens 109 and pinhole mirror 110 and strikes the sensor 111. The sensor 111 outputs the voltage signal corresponding to the light intensity of the interference light.

The voltage signal outputted from sensor 111 is sent via the control circuit 114 to the A/D converter 115, which digitizes the signal and supplies the resulting signal to the computer 116.

The computer 116 moves the phase modulation prism 104 in the direction (F) perpendicular to the optical axis in steps of a constant movement.

At this time, the computer 116 causes the excimer laser oscillator 117 to emit UV laser light in synchronization with the moving timing of the phase modulation prism 104.

The sensor 111 outputs the voltage corresponding to the intensity of the interference light each time the UV laser light is outputted.

The computer 116 takes in each voltage signal outputted from the sensor 111 and digitized at the A/D converter 115 one after another.

The computer 116 divides the voltage signal outputted from the sensor 111 into an N number of equal parts and calculates the phase value $\phi_{base}$ using equation (1) on the basis of the voltage signal at the time when both of the two UV laser beams shifted sideways by the lattice slit 95 have passed through the glass substrate 29a of the phase shift mask 29.

The computer 116 divides the voltage signal outputted from the sensor 111 into an N number of equal parts and calculates the phase value $\phi_{edge}$ using equation (1) on the basis of the voltage signal at the time when one of the two UV laser beams shifted sideways by the lattice slit 95 has passed through the glass substrate 29a and the other UV laser beam has passed through the phase shifter 29b.

The computer 116 calculates the phase value $\theta$ of the phase shifter 29b using equation (4) on the basis of the phase value $\phi_{base}$ and $\phi_{edge}$.

In measuring the phase value using DUV laser light, speckle noise develops, so a method of reducing the effect of speckle noise is used.

The computer 116 gives the diffusing filter rotating mechanism 119 an instruction to drive the diffusing filter and rotates the diffusing filter 118 through a specific angle stepwise.

The computer 116 causes the excimer laser oscillator 117 to output UV laser light each time the diffusing filter 118 rotates, moves the phase modulation prism 104 in the direction (F) perpendicular to the optical axis, takes in the voltage signal outputted from the sensor 111 at this time, and calculates the phase value $\theta$ of the phase shifter 29b as described above.

Then, the computer 116 rotates the diffusing filter 118 by a specific angle stepwise and calculates the phase value $\theta$ of the phase shifter 29b several times as described above.

The computer 116 adds each phase value $\theta$ of the phase shifter 29b each time the diffusing filter 118 is rotated stepwise and calculates the phase value $\theta_0$ of the phase shifter 29b by averaging the addition result over the number of times that the diffusing filter 118 was rotated stepwise.

With the fourth embodiment, because the phase value of the phase shifter 29b is found each time the diffusing filter 118 is rotated and the sum total of the phase value is averaged over the number of times that the diffusing filter 118 was rotated stepwise, thereby calculating the phase value of the phase shifter 29b, it is possible to reduce the effect of speckle noise occurring in measuring the phase value using DUV laser light.

Furthermore, because the UV light emitted from the excimer laser oscillator 117 or Hg—Xe lamp 90 is divided into two light beams shifted sideways by the lattice slit 95, which are projected onto the phase shift mask 29, and the phase value of the phase shifter 29b is measured on the basis of the intensity of interference at the time when the two light beams have passed through the phase shift mask, not only can the phase value of the phase shifter 29b be measured using the excimer laser oscillator 117, but also the phase value of the phase shifter 29b can be measured using the Hg—Xe lamp 90.

With the recent advances in semiconductor technology, it is commonplace to measure the phase value using DUV laser light. In this connection, it is reasonable to use DUV laser light to measure the phase value.

The present invention is not limited to the fourth embodiment, but may be modified as follows.

The laser oscillator is not restricted to the excimer laser oscillator 117. For instance, the phase value may be measured using an ArF laser oscillator with a wavelength of 193 nm.

While in the embodiment, the Hg—Xe lamp 90 and excimer laser oscillator 117 are used as a light source, only the laser oscillator may be used as a light source in the phase value measuring unit, depending on the situation. In this case, an optical system for exchanging between light sources is not necessary.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. An inspection apparatus of a phase shift mask, for obtaining a phase value at a phase shifter of the phase shift mask, the apparatus comprising: a laser source; an optical conversion system for converting a light from the laser source into a point light source, the optical conversion system being intermittently rotatable, an optical system for separating the light passed through the optical conversion system into two polarized light beams and illuminating the polarized light beams onto the phase shift mask;

a detector for detecting an intensity of an interference light by causing the two light beams passed through the phase shift mask to interfere with each other, the detector detecting the intensity of the interference light each time the optical conversion system is stopped) and a phase value detecting unit for obtaining the phase value at the phase shifter on a basis of the intensity of the interference light.

2. The apparatus according to claim 1, the phase value detecting unit averages the intensity of the interference light detected a plurality of times and obtains the phase value of the phase shifter on a basis of the averaged intensity of the interference light.

3. The apparatus according to claim 1, wherein said laser light source outputs laser light with a central wavelength of 300 nm or less.

4. The apparatus according to claim 1, wherein said diffusing optical system is an optical system including a glass substrate having a diffusing surface formed on at least one side of the substrate.

5. The apparatus according to claim 1, wherein said moving means rotates, slides, or reciprocates said diffusing optical system with respect to the laser optical axis.

6. The apparatus according to claim 1, wherein said moving means is composed of a motor and a connection member that connects the axis of rotation of the motor to the center of rotation of said glass substrate, when said diffusing optical system is a glass substrate having a diffusing surface on at least one side of the substrate.

7. The apparatus according to 1, wherein said illumination optical system includes a polarizing beam splitter that separates light into two linearly polarized light beams having polarization planes crossing at right angles with each other.

8. The apparatus according to claim 1, wherein said interference means includes a polarizing beam splitter that superimposes the two linearly polarized light beams passed through said phase shift mask, on one another.

9. The apparatus according to claim 1, wherein said diffusing optical system is a glass substrate having a diffusing surface on one surface, and said moving means moves the glass substrate, said phase value computing means comprises:

first means for receiving the intensity of the interference light generated from the two light beams passed through the phase shift mask, while said moving means is rotating the glass substrate, after said phase-modulating means has changed the phase difference between the two polarized light beams; and second means for obtaining a phase value of said phase shift mask on the basis of the intensity of the interference light supplied to said first means;

third means for causing said first and second means to operate repeatedly, each time rotating the glass substrate through a different angle, thereby calculating a plurality of phase value; and fourth means for averaging the plurality of phase value calculated by said third means.

10. The phase shift mask inspection apparatus according to claim 1, further comprising:

a lamp light source for emitting light in a deep ultraviolet region; and an exchanging optical system for exchanging between the laser light outputted from said laser light source and the light emitted from said lamp light source and sending the light to said illumination optical system.

11. The apparatus according to claim 9, wherein said lamp light source is a mercury-xenon lamp.

12. The apparatus according to claim 9, wherein said illumination optical system includes a first variable magnification optical system that varies the amount of sideways shift in the two polarized light beams shifted sideways, and said interference means includes a second variable magnification optical system that changes the amount of sideways shift in the two polarized light beams passed through said phase shift mask, to an amount equal to the amount of sideways shift in said illumination optical system.

13. The apparatus according to claim 11, wherein said first variable magnification optical system, when a pattern is formed repeatedly on said phase shift mask, varies the amount of sideways shift in said two polarized light beams so that said two polarizd light beams may be shifted from the pitch of the repetition of said pattern.

14. An inspection method of a phase shift mask, for obtaining a phase value at a phase shifter of the phase shift mask by using an apparatus including a laser source, an optical conversion system for converting a light from the laser source into a point light source, an optical system for separating the light passed through the optical conversion system into two polarized light beams and illuminating the polarized light beams onto the phase shift mask, and a detector for detecting an intensity of an interference light by causing the two light beams passed through the phase shift mask to interfere with each other, the method comprising the steps of:

intermittently rotating the optical conversion system;

detecting the intensity of the interference light a plurality of times each time the optical conversion system is stopped; and obtaining the phase value at the phase shifter on a basis of the intensity of the interference light.

15. The method according to claim 14, further comprising the steps of:

averaging the intensity of the interference light detected a plurality of times; and obtaining the phase value of the phase shifter on the basis of the averaged intensity of the interference light.

* * * * *